US011527885B2

(12) United States Patent
Palmer et al.

(10) Patent No.: US 11,527,885 B2
(45) Date of Patent: Dec. 13, 2022

(54) SUPERCONDUCTING FAULT CURRENT LIMITER

(71) Applicant: ROLLS-ROYCE plc, London (GB)

(72) Inventors: Chloe J. Palmer, Derby (GB); Stephen M. Husband, Derby (GB)

(73) Assignee: ROLLS-ROYCE PLC, London (GB)

( * ) Notice: Subject to any disclaimer, the term of this patent is extended or adjusted under 35 U.S.C. 154(b) by 944 days.

(21) Appl. No.: 16/299,765

(22) Filed: Mar. 12, 2019

(65) Prior Publication Data

US 2019/0312428 A1 Oct. 10, 2019

(30) Foreign Application Priority Data

Apr. 9, 2018 (GB) ...................... 1805866

(51) Int. Cl.
*H02H 9/02* (2006.01)
*H01F 6/02* (2006.01)
*H01L 39/16* (2006.01)
*H01F 6/00* (2006.01)

(52) U.S. Cl.
CPC ............. *H02H 9/023* (2013.01); *H01F 6/02* (2013.01); *H01L 39/16* (2013.01); *H01F 2006/001* (2013.01)

(58) Field of Classification Search
CPC .......... H02H 9/02; H02H 9/023; H02H 7/001; H01L 39/16; H01L 39/24; H01F 6/02; H01F 2006/001; H01F 6/04; H01B 12/16
USPC ............................................ 361/19; 505/163
See application file for complete search history.

(56) References Cited

U.S. PATENT DOCUMENTS

| 8,037,695 B2 | 10/2011 | Sargent et al. |
| 2003/0164749 A1* | 9/2003 | Snitchler ................. H01L 39/16 338/32 S |
| 2014/0087950 A1 | 3/2014 | Isojima et al. |
| 2018/0152016 A1 | 5/2018 | Honda et al. |

FOREIGN PATENT DOCUMENTS

| EP | 2 711 998 A1 | 3/2014 |
| WO | 2015022423 | 2/2015 |
| WO | 2017010326 | 1/2017 |

OTHER PUBLICATIONS

Great Britain search report dated Oct. 4, 2018, issued in GB Patent application No. 1805866.9.
(Continued)

*Primary Examiner* — Danny Nguyen
(74) *Attorney, Agent, or Firm* — Crowell & Moring LLP

(57) ABSTRACT

A superconducting fault current limiter (10) is shown. It comprises a cryostatic cooling system (20) for containing a cooling medium (26), a superconducting wire (30) immersed in the cooling medium (26) and configured to carry a current, the superconducting wire (30) becoming non-superconducting above a critical current density, and a plurality of heat dissipation elements spaced along and projecting from the superconducting wire (30), wherein the heat dissipation elements have an electrically insulating coating, and whereby the heat dissipation elements transfer heat from the superconducting wire (30) into the cooling medium (26).

8 Claims, 2 Drawing Sheets

(56) References Cited

OTHER PUBLICATIONS

European Search Report, issued in EP Application No. 19 16 1848, dated Sep. 5, 2019, pp. 1-4, European Patent Office, Munich, Germany.
Yasuyuki Shirai et al., "Recovery Characteristics of GdBCO Superconducting Tape with Cooling Fins and Teflon Coating for Resistive Fault Current Limiter," IEEE Transactions on Applied Superconductivity, vol. 26, No. 3, DOI: 10.1109/TASC.2016.2524456, dated Feb. 3, 2016, pp. 1-4, published online by IEEE at URL https://doi.org/10.1109/TASC.2016.2524456.

* cited by examiner

SUPERCONDUCTING FAULT CURRENT LIMITER

CROSS REFERENCE TO RELATED APPLICATIONS

This application claims priority from United Kingdom Patent Application No 1805866.9 filed Apr. 9, 2018, the whole contents of which are incorporated herein by reference in their entirety.

BACKGROUND

This disclosure relates to superconducting fault current limiters.

Fault current limiters can be used to limit potentially damaging fault currents in electric power distribution systems, particularly large-scale high-power networks such as grid-scale transformers or substations. Fault currents are abnormal currents in the electric power distribution system resulting from a fault such as a short circuit. Superconducting fault current limiters (SFCLs) exploit fundamental properties of superconductivity, principally the extremely rapid loss of superconductivity (known as "quenching") above a critical combination of temperature, current density and magnetic field strength, to limit fault currents.

In normal operation, when a current density in an SFCL is below a critical current density, a superconductor in the SFCL has a low impedance and is in a superconducting state. To maintain the superconductor in a superconducting, low impedance state during normal operation, the superconductor is operated below a critical combination of temperature, current density and magnetic field strength. Generally, an SFCL comprises a superconductor positioned within a cryostat, or similar cooling tank, in order to maintain the superconductor below a critical temperature.

When a fault occurs, the current density in the SFCL exceeds the critical current density, the superconductor's impedance becomes high and the superconductor rapidly stops being superconducting. The high impedance of the superconductor limits the fault current, thereby reducing its potentially damaging effects.

Example SFCLs are disclosed in U.S. Pat. No. 8,037,695 B2 and International Patent Publication No 2015/022423 A1, the latter of which aims to provide a low inductance during normal operation and a rapid and even quench under fault current conditions.

However, when a quench occurs due to a fault current through an SFCL, the superconductor rapidly heats up. Following clearance of the fault, the superconductor must be cooled to below its critical temperature before it can return to its superconducting state and resume normal operation. This can take many minutes.

Therefore, it would be desirable to provide a superconducting fault current limiter that can be cooled at a faster rate after clearance of a fault current.

SUMMARY

There is therefore provided a superconducting fault current limiter comprising:

a cryostatic cooling system for containing a cooling medium;

a superconducting wire immersed in the cooling medium and configured to carry a current, the superconducting wire becoming non-superconducting above a critical current density; and a plurality of heat dissipation elements spaced along and projecting from the superconducting wire, wherein the heat dissipation elements have an electrically insulating coating, and whereby the heat dissipation elements transfer heat from the superconducting wire into the cooling medium.

The heat dissipation elements improve the thermal diffusivity between the superconducting wire and the cooling medium during and after a fault. The additional thermal surface area provided by the heat dissipation elements results in a faster rate of heat dissipation through the cooling medium, thereby reducing the cool down time necessary for resumption of normal operation. Reducing the cool down time of the superconducting wire in turn reduces an outage time in the event of a fault. The electrically insulating coating helps to prevent short circuits between the heat dissipation elements.

Furthermore, a shorter superconducting wire may be used, whilst still providing a same thermal surface area, because the need for other types of thermal stabilisers generally used in SFCLs can be reduced or eliminated. Therefore the size and weight of the SFCL may also be reduced.

The heat dissipation elements may project from the superconducting wire perpendicularly to the length direction of the superconducting wire. This helps to prevent short circuits between the heat dissipation elements.

The heat dissipation elements may be spaced apart from one another along the superconducting wire by a distance that ensures a sufficient voltage withstand when the superconducting wire becomes non-superconducting. In other words, the heat dissipation elements may be spaced apart from one another by a distance such that they are electrically insulated from one another even if/when there is a large voltage drop along the length of the superconducting wire when the superconducting wire is quenched. Therefore, short circuits may be prevented.

The superconducting wire may be arranged such that when the superconducting wire carries a current, any generated magnetic fields are substantially cancelled by each other. By balancing the generated magnetic field, an even quench may be achieved.

A first portion of the superconducting wire may be spiralled around a first axis, and a second portion of the superconducting wire may be spiralled around a second axis. Further, the first and second portions may be arranged such that, when the superconducting wire carries a current, a magnetic field generated from the current flowing in the first portion may be substantially cancelled by a magnetic field generated from the current flowing in the second portion. This configuration can enable an even quench to be achieved.

As an example, the first and second portions of superconducting wire may be spiralled around respective cores centred on the respective axes. In other words, the first and second portions may form coils around respective cores.

The heat dissipation elements projecting from the first portion of superconducting wire may project away from the first axis, and the heat dissipation elements projecting from the second portion of superconducting wire may project away from the second axis. This also helps to prevent short circuits between the heat dissipation elements.

The cryostatic cooling system may comprise an outer container and an electrically insulating inner container positioned within the outer container, the inner container containing the cooling medium. The electrically insulating inner container helps to mitigate electrical discharges during normal operation when the superconducting wire is superconducting. As the inner electrically insulating container provides electrical and thermal insulation, arcing between the heat dissipation elements and the outer container can be reduced, or prevented. A side wall thickness of the inner container may taper from a maximum at a first end of the inner container, to a minimum at an opposite second end of the inner container, and electrical leads for joining to respective ends of the superconducting wire may pass into the inner container at or adjacent the first end. By tapering the side wall thickness of the inner container in this way, the electric field across the cryostatic cooling system can be balanced, thereby reducing electrical stresses. This is because the highest voltage value across the superconducting fault current limiter is generally at a position where these leads pass into the inner container. By having a maximum side wall thickness at the first end, the extra side wall thickness of the electrically insulating inner container compensates for the locally increased voltage value. Accordingly, electrical stresses can be reduced and the electrical field across the cryostatic cooling system can be balanced.

When the wall thickness of the inner container tapers from a maximum at a first end of the inner container to a minimum at an opposite second end of the inner container, the heat dissipation elements in closest proximity to the second end of the inner container may project a greater distance from the superconducting wire and/or may have a greater surface area than the heat dissipation elements in closest proximity to the first end of the inner container. Additionally or alternatively, there may be a greater density of heat dissipation elements at the second end than at the first end. This results in an increased rate of cooling of the superconducting wire whilst ensuring that the superconducting wire is electrically insulated from the outer container.

When the wall thickness of the inner container is tapered, thermal flows may be unbalanced across the superconducting fault current limiter. By varying the lengths of the heat dissipation elements and/or their density, a better balance can be achieved.

A gap may space the inner container from the outer container, the gap containing a vacuum. Alternatively, the inner container may be flush, i.e. in physical contact, with the inside walls of the outer container.

A plurality of cooling elements may project from the outer container through the inner container and into the cooling medium. The cooling elements may be formed from a highly thermally conductive material, such as copper, in order to further enhance the cooling of the superconducting wire. Each cooling element may be spaced from the heat dissipation elements by at least a distance capable of preventing and/or limiting the possibility of electrical discharges between the heat dissipation elements and the cooling elements (and thence the outer container).

DESCRIPTION OF THE DRAWINGS

Embodiments will now be described by way of example only with reference to the accompanying drawings, which are purely schematic and not to scale, and in which.

DETAILED DESCRIPTION

Superconducting fault current limiters can be implemented in electric power distribution systems to limit potentially damaging fault currents resulting from faults, such as short circuits.

Figure 1:
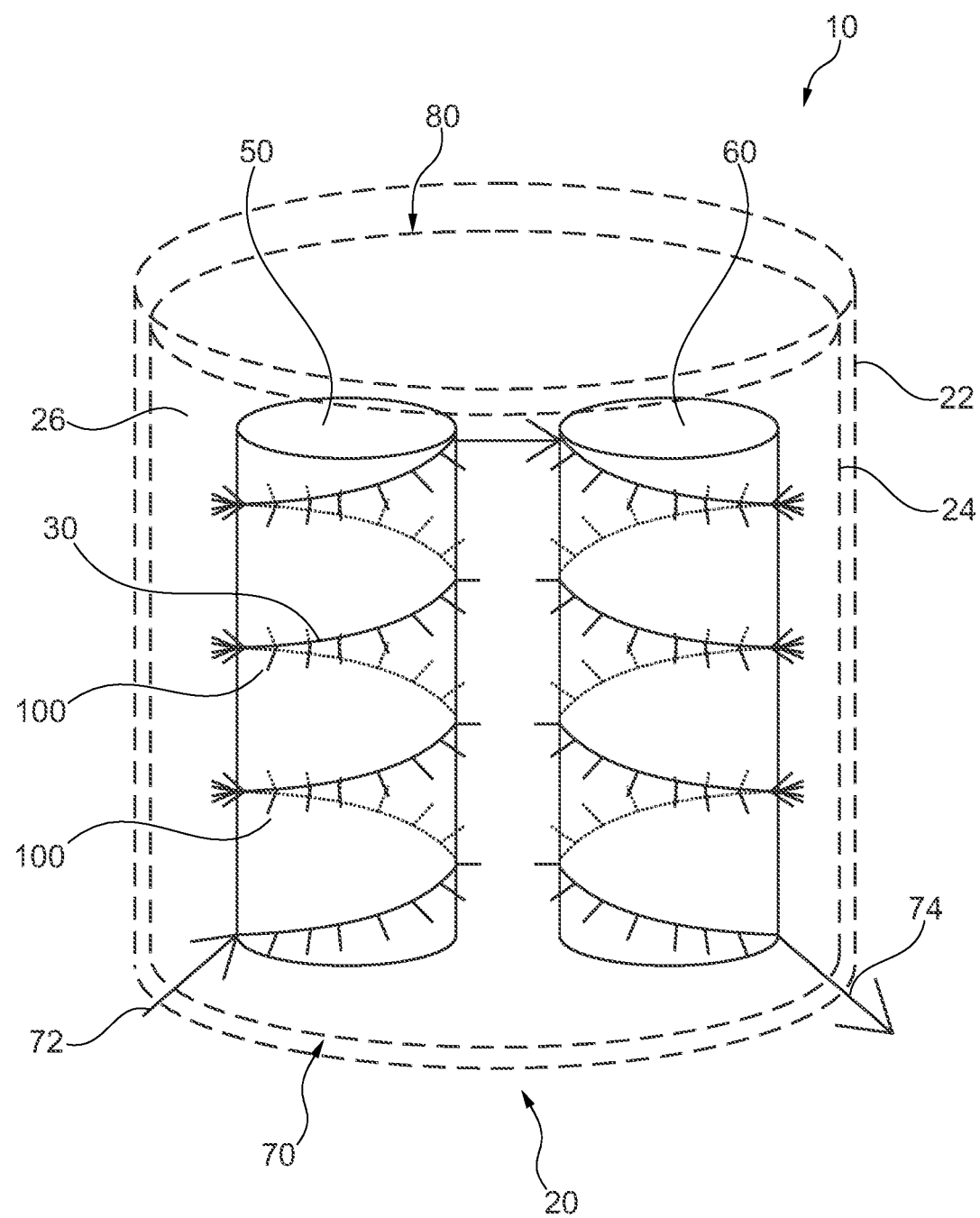
FIG. 1 shows a superconducting fault current limiter according to one example.

With reference to FIG. 1, a superconducting fault current limiter (SFCL) 10 according to one example comprises a cryostatic cooling system 20. The cryostatic cooling system 20 comprises an outer container 22, and an inner container 24, wherein the inner container 24 is positioned within the outer container 22. The inner container 24 contains a cooling medium 26 capable of reaching superconducting low temperatures suitable for maintaining superconductors in a superconducting state. The cooling medium 26 may be liquid nitrogen and/or liquid helium, for example.

The outer container 22 is formed from a thermally conductive material, such as copper. The outer container 22 may be additionally cooled from the outside. Preferably, the outer container 22 has a low electrical conductivity at low superconducting temperatures. The cryostatic cooling system 20 may be maintained within a vacuum in order to shield the cryostatic cooling system 20 from room temperature.

The inner container 24 is formed from any suitable electrically insulating material, such as alumina and/or resin, such as epoxy resin, and provides electrical insulation and thermal insulation. The inner container 24 may be spaced from the inside of the outer container 22 by a vacuum. In other words, a gap containing a vacuum may space the inner container 24 from the inside of the outer container 22. Alternatively, the outer container 22 may be flush with the inner container 24 such that there is no spacing between the outer container 22 and the inner container 24. For example, resin tape may be layered on the inner surface of the outer container 22 to form the inner container 24.

A superconducting wire 30 is positioned in the cooling medium 26 within the inner container 24. The superconducting wire 30 may be formed from any suitable superconducting material, and may be provided in any suitable form, for example a tape, a wire, a multi-strand wire, or a multi-core arrangement. The superconducting wire 30 may be spiralled (i.e. coiled) around one or more axes. In the example shown in FIG. 1, the superconducting wire 30 is coiled around a first core 50 and a second core 60. The first and second cores 50, 60 support the superconducting wire 30 within the cryostatic cooling system 20. The first and second cores 50, 60 are formed from an electrically-insulating material in order to prevent short-circuits between the turns of the coil of superconducting wire 30. Further, the turns of the coil of superconducting wire 30 are spaced from one another along a length of the first and second cores 50, 60 to prevent short circuits between the turns, even if/when high fault currents are passed through the superconducting wire 30.

The inner container 24 has a first end 70 and an opposite second end 80. Electrical current enters and exits the cryostatic cooling system 20 via the respective leads 72, 74 which pass into the inner container 24 at or adjacent the first end 70. In normal operating conditions, when the cryostatic cooling system 20 cools the superconducting wire 30 to below its critical temperature such that the superconducting wire 30 has a low impedance, a current flows through the leads 72, 74 and the superconducting wire 30, as indicated in FIG. 1 by arrows. In FIG. 1 the leads 72, 74 are shown entering the inner container 24 at its base, and the first and second cores 50, 60 are attached to the base. Alternatively, the leads 72, 74 may enter at the top of the inner container 24, and the first and second cores 50, 60 may be attached to the top. Particularly if the top is a lid (removable to allow the cooling medium to be poured in to the inner container 24), this arrangement can facilitate installation and maintenance of the SFCL.

The superconducting wire 30 may be arranged within the inner container 24 so that any magnetic field generated from a current flowing though the superconducting wire 30 is substantially cancelled. In the example shown in FIG. 1, the magnetic field generated by a current flowing in a first portion of superconducting wire 30 spiralled around the first core 50, is substantially cancelled by the magnetic field generated by the current flowing in a second portion of superconducting wire 30 spiralled around the second core 60. This is because the overall direction of current in the first portion of superconducting wire 30 is equal and opposite to the overall direction of current in the second portion of superconducting wire 30. Therefore, the respective generated magnetic field vectors resulting from the current in the first and second portions of superconducting wire 30 cancel with each other. This promotes a substantially uniform magnetic field density across the SFCL 10, which leads to even quenching.

When a fault, such as a short circuit, occurs in the electric power distribution system, a large load is applied to the system, resulting in a large fault current. The fault current raises the current density in the superconducting wire 30 to above its critical current density. This results in a sudden rise in the impedance of the superconductive wire 30, and the fault current is therefore limited. Quenching can occur more quickly than conventional circuit breakers can respond to faults in the electric power distribution system, and therefore any damage to the system is reduced.

During quenching, the superconducting wire 30 heats up rapidly. Once the fault has been removed from the system, the superconducting wire 30 must be cooled to below its critical temperature in order to return to a superconducting state for normal operation. As shown in FIG. 1, heat dissipation elements 100 spaced along and projecting from the superconducting wire 30 improve the thermal diffusivity between the superconducting wire 30 and the cooling medium 26 during and after the fault so that heat may be dissipated effectively. Therefore, the superconducting wire 30 can be cooled quickly, and returned to its superconducting state quickly. The heat dissipation elements 100 may be any shape suitable for improving the thermal diffusivity and reducing thermal resistance to the cooling medium 26 (for example, wires and/or fins). The heat dissipation elements 100 are typically formed from a highly thermally conductive material, such as copper.

As can be seen in FIG. 1, the heat dissipation elements 100 project from the superconducting wire 30 perpendicularly to the length direction of the superconducting wire 30, and also perpendicularly to the long axes of the cores 50, 60. This reduces the possibility of short circuits between the heat dissipation elements 100 themselves, and between the heat dissipation elements 100 and the superconducting wire 30. The heat dissipation elements 100 are also spaced apart from one another along the length of the superconducting wire 30 by a distance that ensures a sufficient voltage withstand. In other words, during a quench when there is a large voltage drop along the length of the superconducting wire 30, the heat dissipation elements 100 must be spaced from one another along the superconducting wire 30 by a distance sufficient to prevent electrical discharges between the heat dissipation elements 100.

The heat dissipation elements 100 may be further electrically insulated from one another by providing a thin coating of electrically insulating material to each of the heat dissipation elements 100.

The inner container 24 reduces the possibility of electrical discharges between the heat dissipation elements 100 and the outer container 22. As the inner container is formed from an electrically insulating material, electrical discharge or "arcing" between the heat dissipation elements 100 and the outer container 22 can be prevented.

The side wall thickness of the inner container 24 may vary along the length of the inner container. In particular, the side wall thickness of the inner container 24 may taper from a maximum thickness at the first end 70 of the inner container 24, to a minimum thickness at the second end 80 of inner container. As the leads 72, 74 are at the first end 70 of the inner container 24, the highest voltage value across the cryostatic cooling system 20 is at the first end 70. The lowest voltage value across the cryostatic cooling system is at the second end 80. Accordingly, the tapering of the side wall thickness of the inner container 24 allows the overall electric field to be balanced. Typically the side wall may have twice the thickness at the second end than at the first end.

Conveniently, a cold source (not shown in FIG. 1) of the cryostatic cooling system 20 may be positioned at the first end 70 close to where the leads 72, 74 enter the inner container 24. The leads 72, 74 may then be cooled by the cold source.

In order to balance the thermal flows in the cryostatic cooling system 20, the lengths and/or surface areas of the heat dissipation elements 100 may be varied along the length of the superconducting wire 30 such that heat dissipation elements closest to the second end 80 of the inner container 24 have a greater cooling effectiveness than heat dissipation elements closest to the first end 70. Additionally or alternatively, there may be a greater density of heat dissipation elements at the second end than at the first end.

In a case where the lengths of the heat dissipation elements 100 vary, the relationship between the lengths of the heat dissipation elements 100 and the variation of the side wall thickness of the inner container 24 may be such that there is a constant spacing between each of the heat dissipation elements 100 and the inside of the inner container 24, thereby maintaining electrical insulation from the outer container 22.

Figure 2:
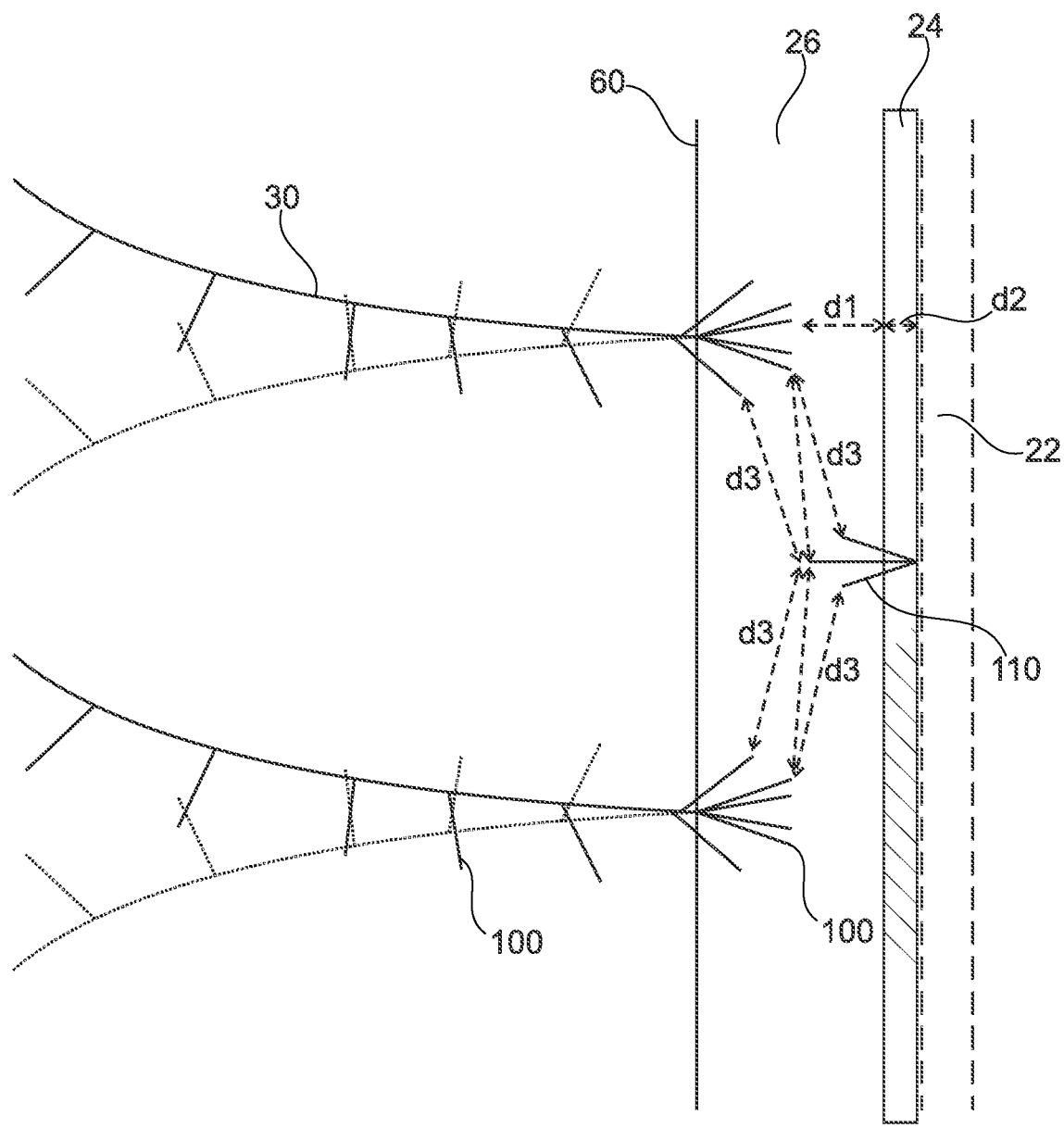
FIG. 2 shows a close up view of part of a superconducting fault current limiter according to another example.

FIG. 2 shows a close up view of part of an SFCL 10 according to another example. The inner container 24 has a thickness d2, and forms an insulating coating to the outer container 22. As in the example of FIG. 1, the superconducting wire 30 is coiled around two cores (FIG. 2 shows the superconducting wire 30 coiled around the second core 60), and a plurality of heat dissipation elements 100 project from the superconducting wire 30 into the cooling medium 26.

However, in the example of FIG. 2, a plurality of cooling elements 110 project from the outer container 22, through the inner container 24, and into the cooling medium 26. The cooling elements 110 may be any shape (for example, wires and/or fins) suitable for improving the thermal diffusivity and reducing thermal resistance from the cooling medium 26 to the outer container 24. Accordingly, the cooling elements 110 can be formed from a highly thermally conductive material, such as copper. The cooling elements 110 further enhance the cooling of the superconducting wire 30.

In order to prevent and/or limit the possibility of electrical discharges between the heat dissipation elements 100 and the cooling elements 110 (and thence the outer container 22), each cooling element 110 is appropriately spaced from the heat dissipation elements 100.

More particularly, the electrical conductance of a material between two objects is proportional to the material's electrical conductivity and the distance between the two objects. If the conductivity of the cooling medium 26 is $\sigma 1$, and the conductivity of the inner container 24 is $\sigma 2$, at a position of closest approach of a cooling element 100 to the inner container 24, the conductance between the heat dissipation elements 100 and the outer container 22 is $\sigma1 \cdot d1 + \sigma2 \cdot d2$, where d1 is the smallest distance between the heat dissipation elements 100 and the inner container 24, and d2 is the thickness of the inner container 24.

The cooling elements 110 should then be located such that they are spaced from the heat dissipation elements 100 by a distance providing a conductance of at least $\sigma1 \cdot d1 + \sigma2 \cdot d2$ between each cooling element 110 and the closest heat dissipation element 100. In other words, $\sigma1 \cdot d1 + \sigma2 \cdot d2 = \sigma1 \cdot d3$, where d3 is the distance of closest approach of the heat dissipation elements 100 to the cooling elements 110.

When each cooling element is spaced at least a distance d3 away from the heat dissipation elements 100, enhanced cooling of the superconducting wire 30 can be achieved without increasing the possibility of electrical discharge between the heat dissipation elements 100 and the outer container 22.

SFCLs as described herein may be advantageously used in aeronautical or marine applications.

The invention claimed is:

1. A superconducting fault current limiter comprising:
    a cryostatic cooling system for containing a cooling medium;
    a superconducting wire immersed in the cooling medium and configured to carry a current, the superconducting wire becoming non-superconducting above a critical current density; and
    a plurality of heat dissipation elements spaced along and projecting from the superconducting wire, wherein the heat dissipation elements have an electrically insulating coating, and whereby the heat dissipation elements transfer heat from the superconducting wire into the cooling medium,
    wherein
    a first portion of the superconducting wire is spiralled around a first axis;
    a second portion of the superconducting wire is spiralled around a second axis; and
    the first and second portions are arranged such that, when the superconducting wire carries the current, a magnetic field generated from the current flowing in the first portion is substantially cancelled by a magnetic field generated from the current flowing in the second portion.

2. The superconducting fault current limiter according to claim 1, wherein the heat dissipation elements project from the superconducting wire perpendicularly to the length direction of the superconducting wire.

3. The superconducting fault current limiter according to claim 1, wherein the heat dissipation elements projecting from the first portion of superconducting wire project away from the first axis, and the heat dissipation elements projecting from the second portion of superconducting wire project away from the second axis.

4. The superconducting fault current limiter according to claim 1, wherein the cryostatic cooling system comprises:
    an outer container; and
    an electrically insulating inner container positioned within the outer container, the inner container containing the cooling medium.

5. The superconducting fault current limiter according to claim 4, wherein a side wall thickness of the inner container tapers from a maximum at a first end of the inner container, to a minimum at an opposite second end of the inner container, and electrical leads for joining to respective ends of the superconducting wire pass into the inner container at or adjacent the first end.

6. The superconducting fault current limiter according to claim 5 wherein the heat dissipation elements closest to the second end of the inner container project a greater distance from the superconducting wire, and/or have a greater surface area, than the heat dissipation elements closest to the first end of the inner container.

7. The superconducting fault current limiter according claim 4 wherein a gap spaces the inner container from the outer container, the gap containing a vacuum.

8. The superconducting fault current limiter according to claim 4, wherein a plurality of cooling elements project from the outer container through the inner container and into the cooling medium.

* * * * *